United States Patent [19]
Tanaka et al.

[11] Patent Number: 4,930,112
[45] Date of Patent: May 29, 1990

[54] SEMICONDUCTOR DEVICE HAVING A VOLTAGE LIMITER

[75] Inventors: Hitoshi Tanaka, Tachikawa; Ryoichi Hori, Tokyo; Kiyoo Itoh, Higashikurume; Katsutaka Kimura, Sagamihara; Katsuhiro Shimohigashi, Musashimurayama, all of Japan

[73] Assignees: Hitachi, Ltd.; Hitachi VLSI Engineering Corporation, both of Tokyo, Japan

[21] Appl. No.: 934,546

[22] Filed: Nov. 24, 1986

[30] Foreign Application Priority Data

Nov. 22, 1985 [JP] Japan .................. 60-261213

[51] Int. Cl.⁵ .................. G11C 7/00; G06O 11/00
[52] U.S. Cl. .................. 365/226; 365/227; 307/296.4
[58] Field of Search .................. 365/226, 227, 189.03; 307/297, 296.4

[56] References Cited

U.S. PATENT DOCUMENTS

| | | | |
|---|---|---|---|
| 4,433,390 | 2/1984 | Carp et al. | 365/226 X |
| 4,482,985 | 11/1984 | Itoh et al. | 365/226 |
| 4,627,034 | 12/1986 | Herndon | 365/226 |
| 4,691,304 | 9/1987 | Hori et al. | 365/226 |

FOREIGN PATENT DOCUMENTS 57-172761 10/1982 Japan.
58-70488 4/1983 Japan.
59-111514 6/1984 Japan.

OTHER PUBLICATIONS

Basic Integrated Circuit Engineering, McGraw Hill, 1975, by Hamilton et al., pp. 22-25, (no translation/-Japanese).
Institute of Electronics and Communication Engineers of Japan, vol. 2, No. 244, (1984).

Primary Examiner—Stuart N. Hecker
Assistant Examiner—Alyssa H. Bowler
Attorney, Agent, or Firm—Antonelli, Terry

[57] ABSTRACT

A semiconductor device comprising a plurality of circuits driven by at least one external power source, and at least one voltage converter transforming the voltage of the external power source into another voltage. At least a part of the plurality of circuits are driven by the output voltage of the at least one voltage converter, which is provided with a controller for controlling its load driving power, corresponding to the operation of the part of the plurality of circuits. The voltage converter includes a voltage limiter which is used exclusively for each of the different natures of the loads, and its operation and load driving power are controlled, depending on the operations of each of the loads.

27 Claims, 14 Drawing Sheets

F I G. 12
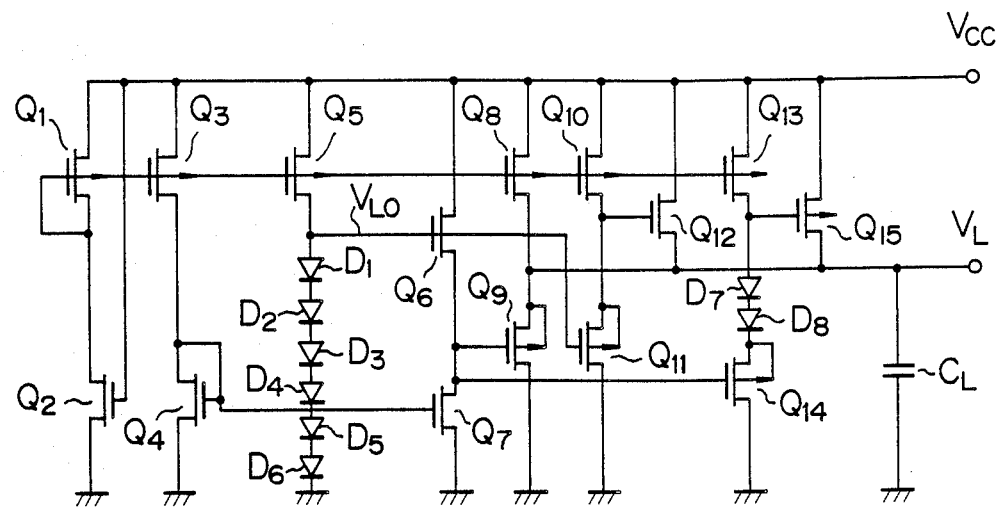
F I G. 13
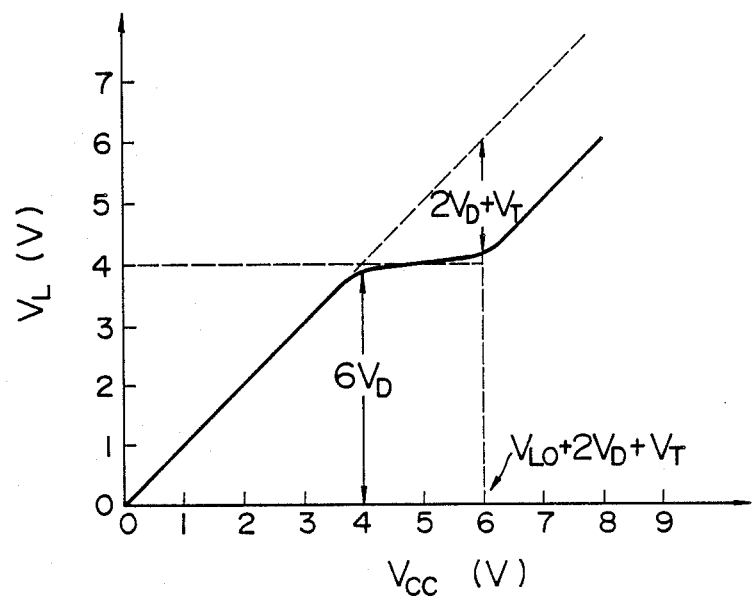

BC

SEMICONDUCTOR DEVICE HAVING A VOLTAGE LIMITER

BACKGROUND OF THE INVENTION

This invention relates to a semiconductor device, in which an external supply voltage is dropped through a voltage limiter on chip and circuits on the chip are driven by a voltage thus obtained.

Several Japanese patent applications relating to this type of voltage limiter, disclosing the following content have already been filed by the inventors of this invention.

FIG. 1 is a scheme illustrating the device disclosed in JP-A-57-172761 previously filed, in which small size MOS transistors 40 are used for a memory array and its associated circuits determining the effective degree of integration of a chip. These transistors 40 are driven by a voltage $V_0$ obtained by dropping an external supply voltage $V_{CC}$ through a voltage limiter 13. To the contrary, relatively large MOS transistors 50 are used for other circuit areas including input and output interface circuits. These large transistors 50 do not play such an important role in the determination of the degree of integration, and are driven by $V_{CC}$ applied thereto In the figure, the reference numeral 20 represents an oxide film; 30 is a diffusion layer and 60 is a gate electrode of a transistor. Owing to this structure, it is possible to realize a high integration MOS memory LSI working with $V_{CC}$, seen from the outside of the chip. The performance of a device according to this method depends strongly on how the voltage limiter circuit is constructed, and some concrete embodiments thereof are described in JP-A-59-111514. Hereinbelow their outline will be described.

FIG. 2 is a scheme illustrating the construction of the voltage limiter circuit. This circuit is constructed by a reference voltage generator indicated by VR, a level shift circuit consisting of an MOS transistor $Q_D$ and a resistor $R_{PP}$, and an MOS transistor $Q_C$ for voltage control. $V_{PP}$ represents a source voltage, which is so set that $V_{PP} \geq V_L + V_T$, where $V_T$ is the threshold voltage of the transistor $Q_D$. $Q_C$ and $Q_D$ are n-channel MOS transistors. The reference voltage $V_L$ produced by VR is transformed into $V_L + V_T$ by the level shift circuit, where $V_T$ represents the threshold voltage of the transistors $Q_C$, $Q_D$. When this voltage is applied to the gate of $Q_C$, a voltage obtained by subtracting the threshold voltage $V_T$ from the gate voltage, i.e. the voltage $V_L$, is produced at the source of $Q_C$, which voltage $V_L$ is the output voltage of the limiter circuit. FIG. 3 shows transient characteristics, in the case where this circuit is applied for charging a capacitive load. In FIG. 2, when a switch S is closed, the output voltage $V_0$ drops at first, because electric charge stored in the parasitic capacitance of wires, e.g. $C_P$, etc. is absorbed by the capacitance of the load C. Then, since the gate-to-source voltage $V_{GS}$ of $Q_C$ exceeds its threshold voltage, electric charge flows from $V_{CC}$ through $Q_C$ into C. Owing to this electric charge, $V_0$ rises and when $V_{GS}$ reaches $V_T$, the charge is stopped and $V_0$ is held at the level of $V_L$, because $Q_C$ is switched off. However, as can be seen from FIG. 3, since $V_{GS}$ becomes smaller, as $V_0$ rises, its rising speed becomes progressively smaller and it does almost not rise in the neighborhood of $V_T$. In order to increase this rising speed, the channel width of $Q_C$ may be enlarged. However, when it is excessively enlarged, the rising speed is lowered, because the output voltage bounce is transmitted also to the gate through the gate-to-source capacitance of $Q_C$ and its voltage is lowered, as indicated in FIG. 3. This gives rise to increase of the on-resistance of $Q_C$. Consequently this method is not suitable for driving too large a load.

FIGS. 4 and 5 respectively indicate a voltage limiter circuit according to another method and driving waveforms therefor. This circuit is described e.g. in the preliminary report Vol. 2, No. 244 of the national meeting of the Institute of Electronics and Communication Engineers of Japan, 1984. This circuit is characterized in that a voltage comparator CA comparing the limiter output voltage $V_0$ with a reference voltage $V_L$ is disposed, the output voltage $V_C$ of which is applied to the gate of an MOS transistor $Q_C$ so as to control the current flowing through $Q_C$ and negatively fed back so that the output voltage $V_0$ is kept at $V_L$. For example, if the current flowing through a load Z increases and $V_0$ falls below $V_L$, $V_C$ becomes lower than its previous voltage. This raises the source-to-gate voltage of $Q_C$, which is a p-channel MOS transistor, and increases the current flowing through $Q_C$. As the result, when $V_0$ rises and exceeds $V_L$, at this time, inversely, $V_C$ rises. This decreases the current flowing through $Q_C$ and lowers $V_0$. According to this method, this process described above is repeated and $V_0$ is kept at $V_L$.

According to these techniques, since $V_C$ is controlled by switching on and off $Q_C$ and the driving force can be relatively arbitrarily set by the gate voltage of $Q_C$, the problems explained, with regard to FIGS. 2 and 3 are not produced. However, when they are applied to other LSIs in practice, they give rise to inconveniences described below.

FIG. 6 indicates a schematic model, in the case where the voltage limiter described above is applied to a practical LSI. In the figure CA is a voltage comparator; VR is a reference voltage generator; Z is a load; and $R_1$–$R_3$ and $C_1$–$C_3$ are resistances and parasitic capacitances of wires and switches, respectively. Here it is supposed that the load Z consists of capacitive partial loads having values different from each other. FIG. 7 indicates the limiter output voltage $V_0$ and the load terminal voltage, when the switches $S_1$, $S_2$ and $S_3$ connected with these partial loads are turned on in this order. In the figure, the outputs $V_0$ and $V_{01}$ fall, every time either one of the switches is turned on. This is due to the fact that the on-resistance of the MOS transistor $Q_C$ for voltage control is finite and that the charging speed of the load is finite, because the wiring necessarily has a certain parasitic resistance. Such fluctuations in voltage give rise to problems that, e.g. supposing that the switch $S_2$ is controlled by the voltage $V_{01}$ applied to the partial load $C_1$, the timing of the turning-on of $S_2$ is retarded, that the on-resistance is increased, etc. Further, after $S_3$ has been turned on, $V_{01}$ rises towards $V_{CC}$ and becomes equal to $V_L$ at a point of time a, but since there exists a delay $t_d$ in a feedback loop (from the input of the comparator circuit to the drain end of $Q_C$), $Q_C$ is turned on and off repeatedly, as indicated in the figure, when $V_0$ is at the neighborhood of $V_L$ and $V_0$ becomes not $V_L$ but $V_L + \Delta V_L$, which is higher than $V_L$. Furthermore, in the case where this delay is remarkably long, it can happen that $\Delta V_L$ is so large that it exceeds the withstand voltage of the small size elements.

In addition, in the case where loads having different working timings and magnitudes, loads having different natures such as capacitive loads and resistive loads, etc.

are connected with a same limiter, the circuit must be always in the working state and further it is necessary that the driving force of the limiter circuit is adapted to one of the greatest loads. Consequently electric power consumed by the limiter itself is very large.

Although problems, in the case where a plurality of loads are driven, have been described above, similar problems can be produced, even if only one load is driven, in the case where its equivalent impedance varies depending on its working time zone.

SUMMARY OF THE INVENTION

As described above, according to the prior art techniques, since loads operating with different timings were connected together to the output terminal of a limiter, each load was influenced by the others and therefore its operation was unstable. Further, the electric power consumption of the limiter itself was very large. In addition there was a risk that $V_0$ exceeded the breakdown voltage of the elements due to the delay in the feedback loop. Still further, even if only one load was connected thereto, similar problems were produced due to the fact that the equivalent impedance of the load varied depending on its working time zone.

According to this invention, a limiter is disposed, which is used exclusively for each of the different natures of loads, and its operation and load driving power are controlled, depending on the operations of each of the loads.

In this way by disposing a limiter exclusively used for each of different natures of loads and by controlling its operation and load driving power, voltage bounce due to disturbances, etc. between different loads are reduced, permitting stable operation. Further each limiter can set a driving power corresponding to each of the loads and stop its operation, independently of the others, in a time zone, where it is not needed, which makes the electric power consumption smaller. Furthermore, it is possible to design the feedback loop, depending on the load and to minimize inconveniences due to delay produced therein.

An object of this invention is to drive stably the loads connected to the limiter.

Another object of this invention is to reduce electric power consumed by the limiter.

Still another object of this invention is to compensate the delay produced in the feedback loop so that a precise output voltage can be obtained.

These and other objects and many of attendant advantages of this invention will be readily appreciated as the same becomes better understood by reference to the following detailed description when considered in connection with the accompanying drawings.

BRIEF DESCRIPTION OF THE DRAWINGS

FIG. 12 is a circuit diagram according to an embodiment of this invention;

FIG. 13 is a diagram showing a characteristic curve of the circuit indicated in FIG. 12;

DESCRIPTION OF THE PREFERRED EMBODIMENTS

Hereinbelow this invention will be explained in detail by using some preferred embodiments.

Figure 8:
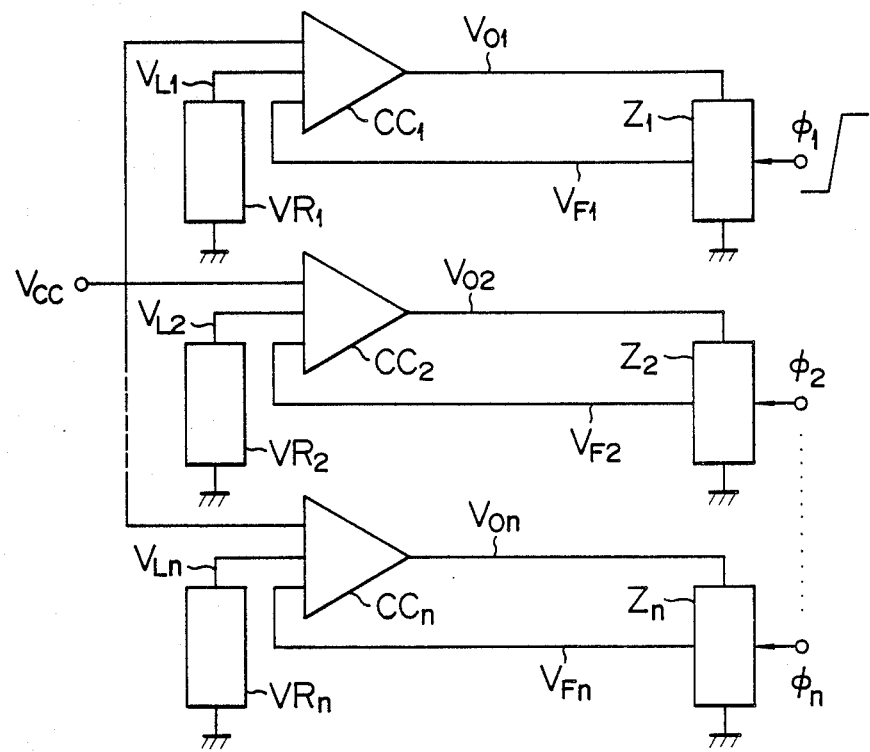
FIGS. 8, 9 and 11 are schemes for explaining the basic conception of this invention.

FIG. 8 indicates an embodiment for explaining the basic conception of this invention, in which $CC_1$-$CC_n$ are voltage limiter circuits, each of which includes a drivability control circuit; $VR_1$-$VR_n$ are reference voltage generators for the voltage limiter circuits; $V_{L1}$-$V_{Ln}$ are reference voltages outputted by the reference voltage generators; $Z_1$-$Z_n$ are loads; and $\phi_1$-$\phi_n$ are driving pulses for the loads. Here each of $CC_1$-$CC_n$ produces an internal supply voltage $V_{01}$-$V_{0n}$ suitable for each of the loads from an external supply voltage $V_{CC}$, referring to $V_{L1}$-$V_{Ln}$. At this time $CC_1$-$CC_n$ are informed on the state of the loads $Z_1$-$Z_n$ through control signals $V_{F1}$-$V_{Fn}$ and control their driving power, referring thereto. For the signals $V_{F1}$-$V_{Fn}$ various signal forms can be arbitrarily chosen, such as simple DC voltage, pulse voltage, etc., depending on each of the cases. Here the values $V_{L1}$-$V_{Ln}$ produced by $VR_1$-$VR_n$ are set, depending on $Z_1$-$Z_n$, but there are cases where some of them are equal to each other. In this case they can be fed with $V_L$ from a common VR.

In addition, although $V_L$ and $V_0$ outputted by CC are so designed that they are generally not equal, it is also possible to dispose an arbitrary voltage transformation circuit within CC and to output another voltage for $V_0$ with reference to $V_L$.

As explained above, according to this embodiment, the voltage bounce due to disturbance between different loads can be eliminated, even if the loads $Z_1$-$Z_n$ are operated at random by the load driving pulses $\phi_1$ to $\phi_n$, because a limiter is disposed, which is used exclusively for each of the loads. Further, since the working state of each of the loads is detected, the driving power therefor can be set accordingly. For example, when its working period is long, the driving power is lowered, or when it is not operated, it is stopped. In this way the electric power dissipation can be reduced. In addition, since it is possible to design the feedback loop corresponding to the load, inconveniences due to delay produced therein can be minimized.

Figure 9:
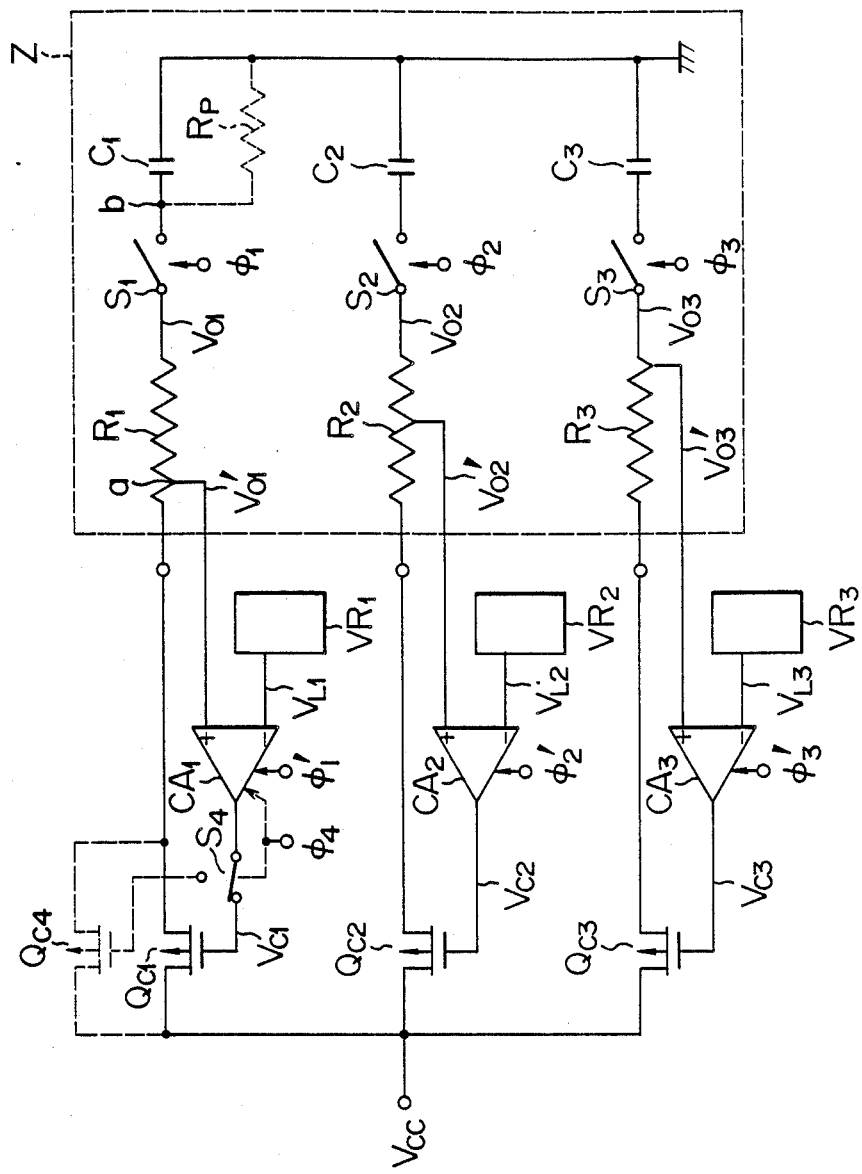
Figure 10:
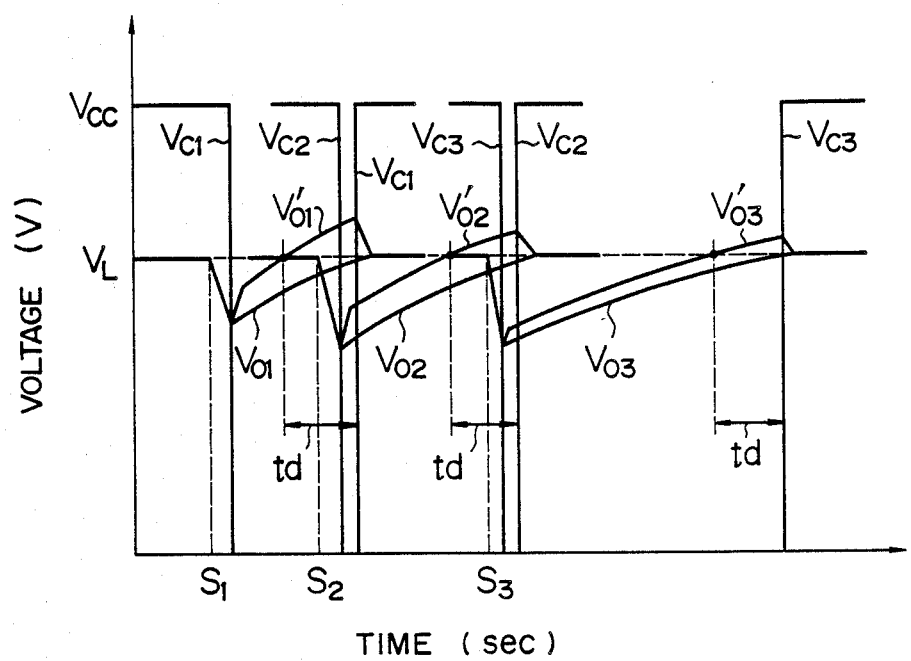
FIG. 10 is a scheme showing waveforms in the circuit indicated in FIG. 9.
Figure 11:
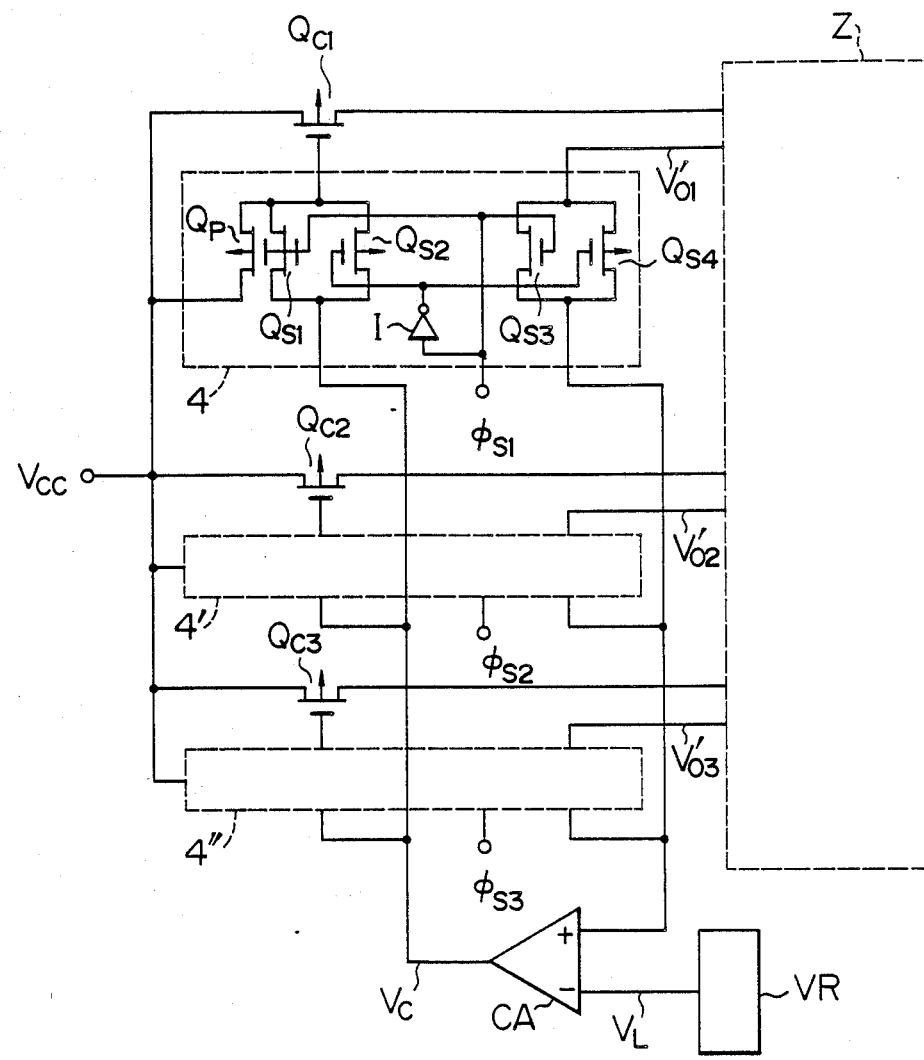

FIGS. 9 and 10 show a more concrete embodiment realizing this invention and operating waveforms therein, respectively. In FIG. 9, $CA_1$-$CA_3$ are voltage comparator circuits; $VR_1$, $VR_2$ and $VR_3$ are reference voltage generators; $QC_1$-$QC_4$ are MOS transistors for voltage control; Z is a load circuit; $R_1$, $R_2$ and $R_3$ are resistances in the wiring to the load; $S_1$, $S_2$ and $S_4$ are switching elements; $C_1$, $C_2$ and $C_3$ are capacitances in the load; $R_P$ is a resistance in the load. The switches $S_1$, $S_2$ and $S_3$ are turned on by signals $\phi_1$, $\phi_2$ and $\phi_3$, respectively. Here a CA coupled with a $Q_C$ corresponds to a CC in FIG. 8. Further $\phi_1'$-$\phi_3'$, $\phi_4'$ etc. correspond to $V_F$.

The features of this embodiment are that it is possible to stop the operation of each of the voltage comparator circuits by using signals $\phi_1'$, $\phi_2'$ and $\phi_3'$ synchronized with $\phi_1$, $\phi_2$ and $\phi_3$, when it is not necessary to charge each of the loads, that it is possible to change over from a capacitive load mode to a resistive load mode so that electric power consumption is reduced, and further that the delay produced in the feedback loop is compensated by utilizing the wiring resistance.

At first the lowering of the electric power consumption will be explained. In the figure the circuit is so constructed that the voltage comparator circuits $CA_1$--$CA_3$ are controlled by the signals $\phi_1'$, $\phi_2'$ and $\phi_3'$. These signals are synchronized with the load driving signals $\phi_1$, $\phi_2$ and $\phi_3$, respectively and they are pulses advanced by the warming up time of the voltage comparator circuits with respect to the latters. Usually each of the loads in the device works only partly in the whole working time of the device. Consequently, if each of the comparator circuits is operated only during the operation of each of the loads, electric power consumption can be reduced by the amount corresponding to the voltage comparator circuits. In addition, in the case where the resistance $R_P$ is connected in parallel with a capacitor $C_1$ as indicated by a broken line in the figure, the limiter should continue to make a certain electric current flow through $R_P$ after having charged $C_1$, but on the other hand the comparator circuit need not to be operated with a high speed. In general, since a differential amplifier such as a comparator circuit works more rapidly with increasing current consumed therein, inversely, in the case where its working speed may be low, electric current flowing therethrough may be reduced. $\phi_4$ in the figure indicates a signal for this purpose, owing to which the comparator circuit $CA_1$ enters into the low electric power consumption mode. Furthermore, if the current flowing through $R_P$ at this time is small and varies with a high speed, the load of the comparator circuit may be reduced so that its working speed is increased, by switching over the voltage drop transistor from $Q_{CI}$ to another smaller size one $Q_{C4}$ by means of a switch $S_4$. In addition, since the capacitance to be discharged becomes smaller, the electric power consumption is lowered correspondingly. Further, in the case where the cycle time of the device is long, since it is not necessary to charge the load with a high speed, the electric power consumption can be reduced by the method described above.

Next the method for compensating the delay produced in the feedback loop will be explained below. In FIG. 9, when $S_1$ is turned on, the voltage $V_{01}$ at the +input of the comparator circuit decreases below the voltage $V_L$ at the −input. Consequently its output voltage $V_{CI}$ becomes 0 V and $Q_{CI}$ is turned on, which raises the voltage applied on the load $C_1$. At this time the voltage $V_{01}'$ at a point a on the wiring is higher than the voltage $V_{01}$ at the terminal b of the load by a voltage across the resistance $R_1$ of the wiring and the switch. Therefore, since the voltage $V_{01}'$ at the point a reaches $V_L$ earlier than the voltage $V_{01}$ at the point b, as indicated in FIG. 10, if the point of time, where the output $V_{CI}$ of the comparator circuit changes from 0 V to $V_{CC}$, is so regulated that it is just in accordance with the point of time, where the voltage $V_{01}$ at the point b reaches $V_L$, by regulating the position of the point a, it is possible that the voltage at the end point of the load after having switched off $Q_{CI}$ becomes exactly $V_L$. In addition, in the case where it is necessary to drive the load with a high speed (within several nanoseconds), it can be thought that the delay cannot be sufficiently compensated. However, in this case, the reference voltage for the limiter driving the load may be lowered by an amount corresponding to the rise of the output voltage due to the delay. The fact that a limiter is disposed for each of the loads is advantageous from this point of view, too.

Figure 1:
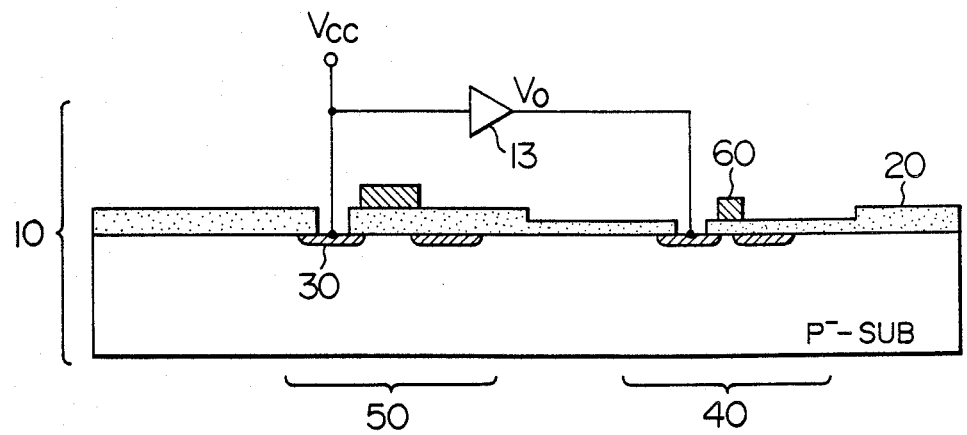
FIG. 1 is a cross-sectional view illustrating the whole construction of a prior art voltage limiter device.
Figure 2:
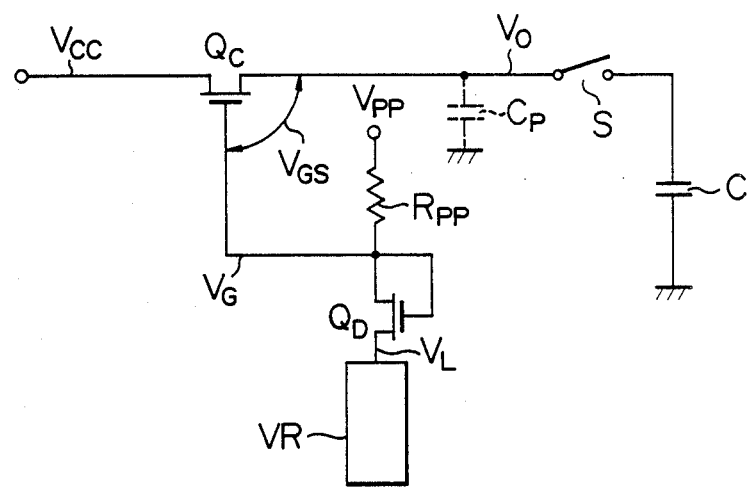
FIGS. 2, 4 and 6 shows circuit diagrams of three different prior art voltage devices.
Figure 3:
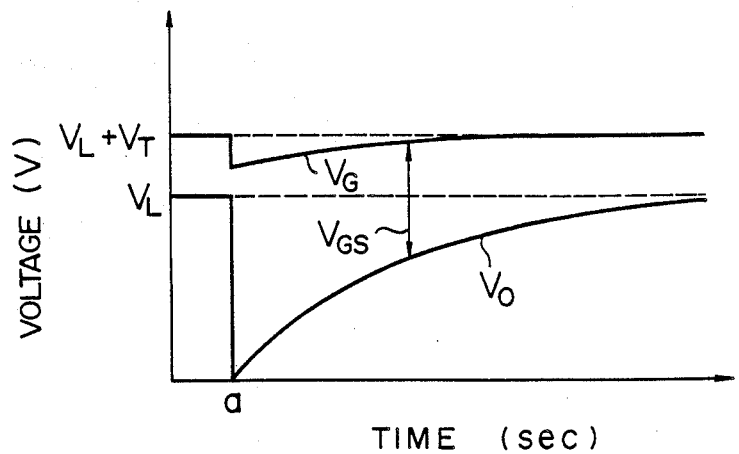
FIGS. 3, 5 and 7 are schemes showing working waveforms for the devices of FIGS. 2, 4 and 6.
Figure 4:
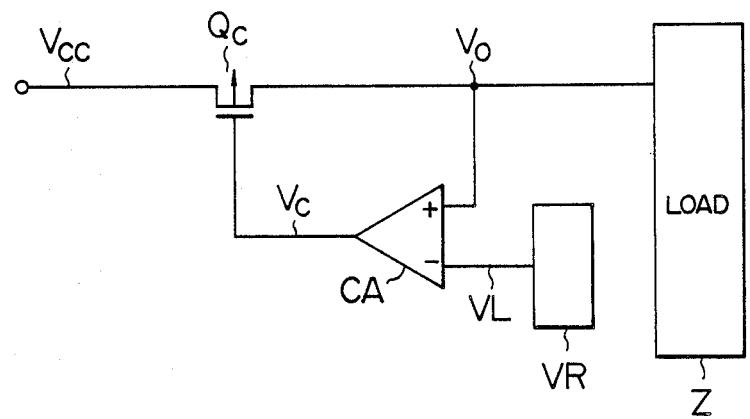
Figure 5:
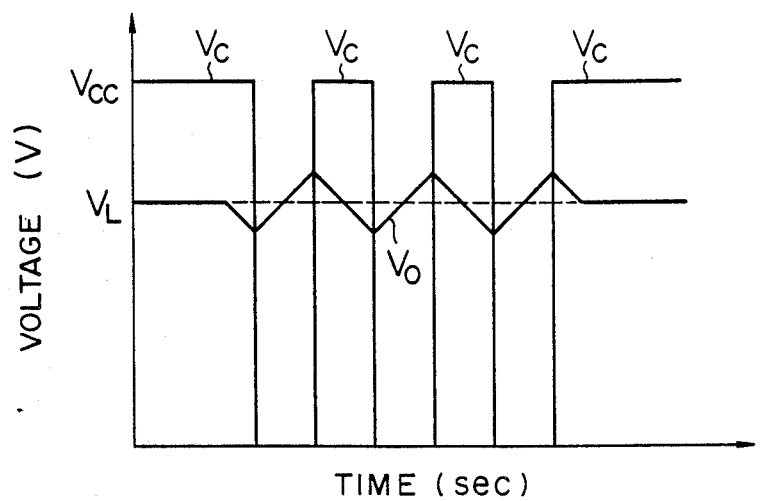
Figure 6:
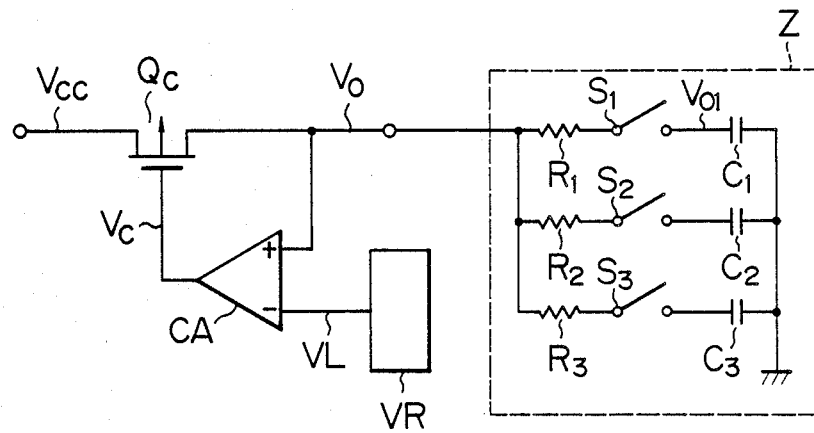
Figure 7:
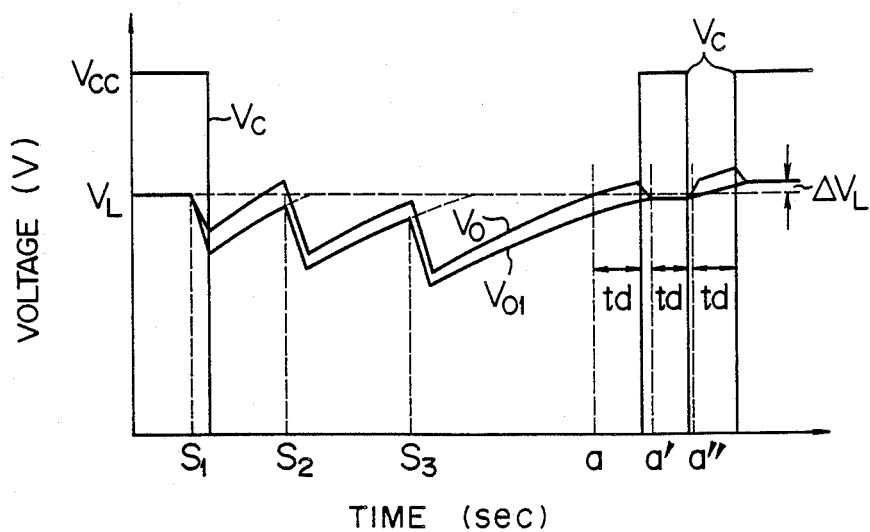

Furthermore, in the case where the interval, with which the load is switched on, is sufficiently greater than the delay of the comparator circuit, a comparator circuit may be used by a plurality of transistors for voltage control in common. In this case it is possible to reduce the layout area of the limiter circuit. In addition, these measures have advantages that all the limiters have identical characteristics and that operations between different loads are made further more stable. In the figure Z indicates the same load as that indicated in FIG. 9 and 4, 4' and 4'' are in/output change over switches for the comparator circuit. $\phi_1$, $\phi_2$ and $\phi_3$ are switch over signals and $Q_{S1}$, $Q_{S2}$ and $Q_{S3}$, $Q_{S4}$ represent switching MOS transistors Further $Q_P$ represents a transistor, which fixes the potential at the gate of the transistor $Q_{CI}$ for voltage control so that it is held at its completely switched off state, when the switching transistors $Q_{S1}$ and $Q_{S2}$ are switched off. Here it is for eliminating voltage loss of the signal that a p-channel MOS transistor and an n-channel MOS transistor are connected in parallel as the switching transistors.

In the embodiments described above the output voltage $V_0$ of the limiter is set at a voltage in reference with the reference voltage $V_L$. Therefore, the characteristics of $V_0$ can be set arbitrarily, depending on the characteristics of $V_L$. When a limiter is used in a semiconductor device, the dependence of $V_0$ on the source voltage $V_{CC}$ is especially important and for the design of the reference voltage generator VR it is necessary to pay attention specifically to the dependence of $V_L$ on $V_{CC}$. With this respect, various examples of the characteristics and methods for generating them, fitting different purposes, are disclosed in JP-A-57-172761, JP-A-58-70482, JP-A-59-111514, etc. It is a matter of course that this invention can be applied thereto, but the dependence of $V_L$ on $V_{CC}$ and a concrete method for realizing it, which is more suitable for operations of semiconductor devices, will be explained below by using a preferred embodiment.

FIGS. 12 and 13 represent the embodiment. FIG. 12 is a circuit diagram of the reference voltage generator and FIG. 13 indicates its characteristics. The feature of this circuit is that the dependence of its output on $V_{CC}$ is small in its usual working region and great above it. In FIG. 12, the circuit consisting of transistors $Q_1$–$Q_4$ is a bias voltage generating circuit, which is so designed that it gives a constant voltage to the gate-to-source of p-channel MOS transistors $Q_5$, $Q_8$, $Q_{10}$, $Q_{13}$ and an n-channel MOS transistor $Q_7$ for making a constant current flow through them. The circuit consisting of $Q_5$ and $D_1$–$D_6$ is an internal reference voltage generator for determining the output voltage $V_L$ of this circuit. Here, a voltage of about 4V is obtained by the forward direction voltage drop across the diodes $D_1$–$D_6$. The circuit composed of $Q_6$–$Q_{12}$ is a buffer circuit for lowering the output impedance of the internal reference voltage generator and for outputting to the outside. This circuit is constituted by a level shift circuit consisting of $Q_5$, $Q_7$ and $Q_{10}$, $Q_{11}$ and a complementary source follower circuit consisting of $Q_9$ and $Q_{12}$. Here, the level shift circuit has a function to compensate the voltage drop corresponding to the threshold voltage in the source follower circuit ($V_{LO}-V_T$ at the gate of $Q_S$, $V_{LO}+V_T$ at the gate of $Q_{12}$) and to output the internal reference voltage to the exterior as it is. As stated later, $Q_{13}-Q_{15}$, $D_7$ and $D_8$ constitute a circuit for increasing the dependence of the output $V_L$ on $V_{CC}$, when $V_{CC}$ exceeds a certain value. Here, $Q_{14}$, $D_9$ and $D_8$ constitute a level shift circuit, which gives a voltage $V_{LO}+2V_D$ to the gate of $Q_{15}$, referring to the voltage $V_{LO}-V_T$ obtained by starting from the internal reference voltage $V_{LO}$ through $Q_6$. In this way, since the gate-to-source voltage of $Q_{15}$ becomes $V_{CC}-(V_{LO}+2V_D)$, $Q_{15}$ is switched on at $V_{CC} \geq V_{LO}+2V_D+V_T (V_{LO}+2V_D+V_T \approx 6V)$, and gives an inclination determined by the resistance ratio of $Q_{15}$ to $Q_S$ to $V_L$. Further, a capacitor $C_L$ is added to the output terminal of this circuit. This is for the purpose of suppressing fluctuations in $V_L$ due to fluctuations of the load.

FIG. 13 indicates the dependence of the output voltage $V_L$ of the circuit on the source voltage $V_{CC}$. When $V_{CC}$ is in a region between 0 and 4V, since the diodes $D_1-D_6$ are in their cut-off state and thus no current flows through $Q_5$, $V_{CC}$ appears as it is at the source terminal of $Q_5$ and $V_L$ becomes equal to $V_{CC}$. When $V_{CC}$ is over 4V, since $D_1-D_6$ are switched on, a current flows through $Q_5$ and a voltage lower than $V_{CC}$ is produced at its source terminal. At this time, since the forward direction voltage drop across the diodes does almost not depend on the current flowing therethrough but rests at a constant value, the voltage $V_{LO}$ at the source terminal of $Q_5$ is almost constant at 4V, which is the forward direction voltage drop produced across 6 diodes. Consequently $V_L$ is also constant at 4V. Then, for the voltages over 6V, $V_L$ increases again with increasing $V_{CC}$. This is because $Q_{15}$ is switched on, as stated above. At this time, when the working source voltage $V_{CC}$ is 5V, FIG. 13 represents a characteristic curve, which is ideal for the design of LSIs, as explained later, and the circuit indicated in FIG. 12 is an embodiment for realizing this ideal characteristic curve.

At first, concerning the $V_L$ characteristics at the neighborhood of the usual working voltage of 5V, in this $V_{CC}$ region, a smaller inclination of $V_L$ with respect to $V_{CC}$ is more favorable to the circuit design. This is because, since the working speed of an MOS transistor is generally strongly influenced by the working voltage, its work is stabilized, corresponding to the stabilization of $V_L$, i.e. to the decrease of the inclination.

Next, concerning the region of $V_{CC}$ below 4 V, generally, although the usual working voltage is 5 V, a $V_{CC}$ working margin, which is so wide that the transistor can be driven by a low voltage $V_{CC}$, which is equivalently equal to 3-4 V, is required. On the other hand there are no problems for small size elements within the circuit, when they are driven by a $V_{CC}$ in this region. In addition, the higher the voltage is, the higher the working speed and the noise margin are. Therefore, it is desired that $V_L$ is set at $V_{CC}$, which is the highest voltage in this region.

Now, operations in the $V_{CC}$ region over 6V, which is used usually for aging test, are described. An aging test is a process for removing beforehand the chips including transistors, whose breakdown voltage is extraordinarily low, while applying a high voltage exceeding the usual working voltage to each of the transistors within each of the chips. In this case, if the voltage stress condition is unbalanced for the large size transistors working at $V_{CC}$ and the small size transistors working at $V_L$, it is impossible to effect an effective aging test. For example, when a voltage stress is applied with $V_{CC}=8V$, 8V is applied to the large size transistors, but if the $V_L$ characteristic curve has a small inclination also in this region, only a voltage, which is as low as 4 V, same as in the usual working region, is applied to the small size transistors, and thus no effective stress is applied to the small size transistors. In order to resolve this problem, it is desirable that the inclination of the $V_L$ characteristic curve is greater in the regions above the usual working region, as indicated in FIG. 13.

From the considerations described above, it can be understood that the circuit indicated in FIG. 12 is an ideal circuit satisfying the above conditions.

Furthermore, although the number of diodes connected in series for generating the internal reference voltage is 6 for obtaining a voltage of about 4 V, it is possible to generate an arbitrary voltage by varying this number and the intensity of the current flowing therethrough, depending on the breakdown voltage of the small size elements. In addition, it is also possible to vary arbitrarily the aging condition by varying the number of $D_7$ and $D_8$ and the channel width of $Q_{15}$. Further, although a plurality of diodes are connected simply in series for generating the internal reference voltage in this embodiment, it is also possible to reduce the temperature dependence of the reference voltage by using a band gap reference voltage generator. In this embodiment the internal reference voltage is outputted to the exterior through a buffer circuit consisting of an MOS transistor, whose input impedance is infinite for a direct current. This is one of the measures not to give any influences to the voltage and the current, in the case where a reference voltage generator of temperature compensation type is used. The construction and the operations of such a band gap reference voltage generator are described e.g. in Shuseki Kairo Kogaku (Integrated Circuit Technology) Vol. 2 by Hisayoshi Yanai and Minoru Nagata (Corona Publishing Co.), Chapters 23 and 24.

As indicated above, in the reference voltage generator, diodes are used as the reference voltage source. Further, in the band gap reference voltage circuit, generally bipolar transistors are used. This is because the forward direction voltage of the diode and the forward direction base-to-emitter voltage of the bipolar transistor are hardly influenced by fluctuations in the fabrication process. In addition, in a device, in which fluctuations in the output voltage of the limiter give rise to no important problems, MOS transistors may be used instead of diodes and bipolar transistors. Although an example, where $V_{CC}=5$ V in the standard working state, has been explained above, this value can be newly set according to the object. Further, it is a matter of course that the flexion point of $V_L$ in the characteristic curve indicated in FIG. 13 can be set arbitrarily according to the object.

By applying $V_L$ stated above to the above embodiments, it is possible to produce an ideal limiter output $V_D$.

In the embodiment indicated in FIG. 12, it is necessary to fabricate bipolar transistors and MOS transistors on a same chip. This can be easily realized by a method described later.

Figure 14:
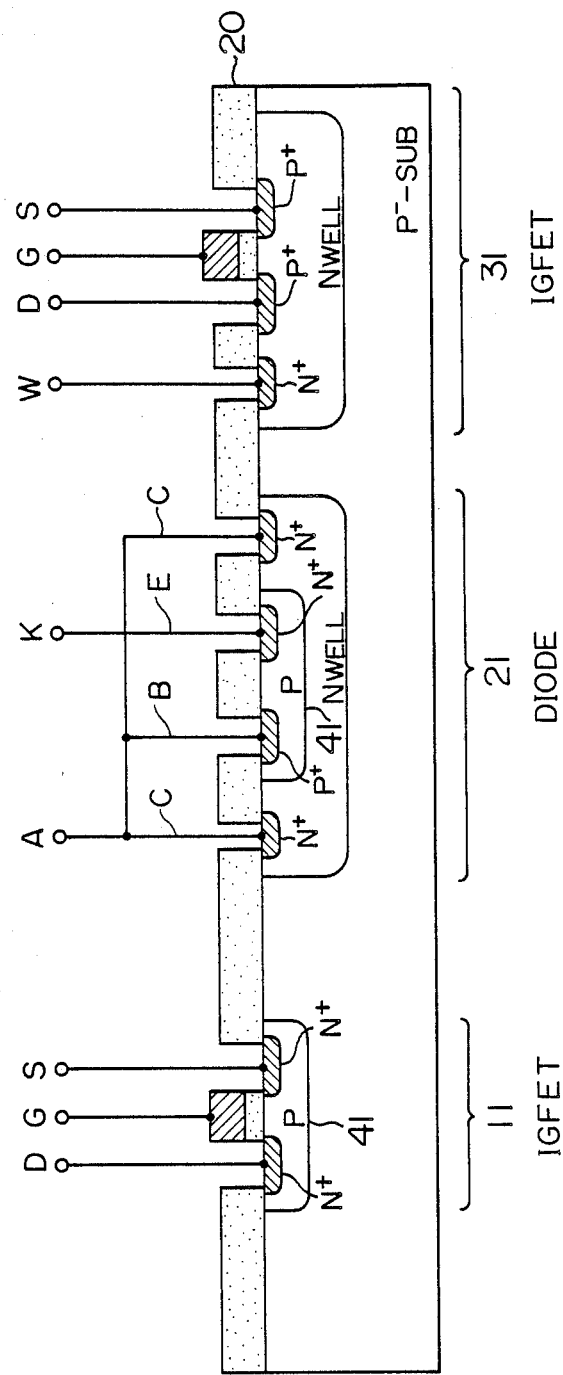
FIG. 14 is a cross-sectional view of an element used in the embodiment.

FIG. 14 is a cross-sectional view, where bipolar transistors and MOS transistors are formed on a same chip. In the figure, the reference numeral 11 represents an n-channel MOS transistor (NMOS); 21 a bipolar transistor; and 31 a p-channel MOS transistor (PMOS). Here, since 11 and 31 are MOS transistors, they can be fabricated by the usual CMOS (complementary MOS) process. However, in order to fabricate the bipolar transistor 21, it is necessary to add an p-conductivity type impurity layer (which will be a base) indicated by 41 thereto. Consequently, a fabrication step for forming this layer is added to the fabrication process. Usually, in an n-channel MOS transistor, p-conductivity type impurities are ion-implanted in the channel in order to raise its threshold voltage (hereinbelow abbreviated to "threshold adjustment implants"). Since this impurity concentration is one most appropriate for the base of a bipolar transistor, when the channel length is under 1 $\mu$m, the increase in the number of fabrication steps can be eliminated by forming the threshold adjustment implant layer and the base layer at the same time.

In this way, since it is possible to form an n-p-n type bipolar transistor, in which an n-well serves as the collector; the threshold adjustment implant layer serves as the base; and an $n^+$ conductivity type layer (formed at the same time as the source and the drain of the n-channel MOS transistor) serves as the emitter, on one chip together with the p- and n-channel MOS transistors, it is possible to realize a circuit, which is stable against fluctuations in the fabrication process and temperature. In addition, the diodes can be obtained by using the base-emitter junction of the bipolar transistor indicated in FIG. 14 or by using the junction between the emitter and the collector-base connected together.

Figure 15:
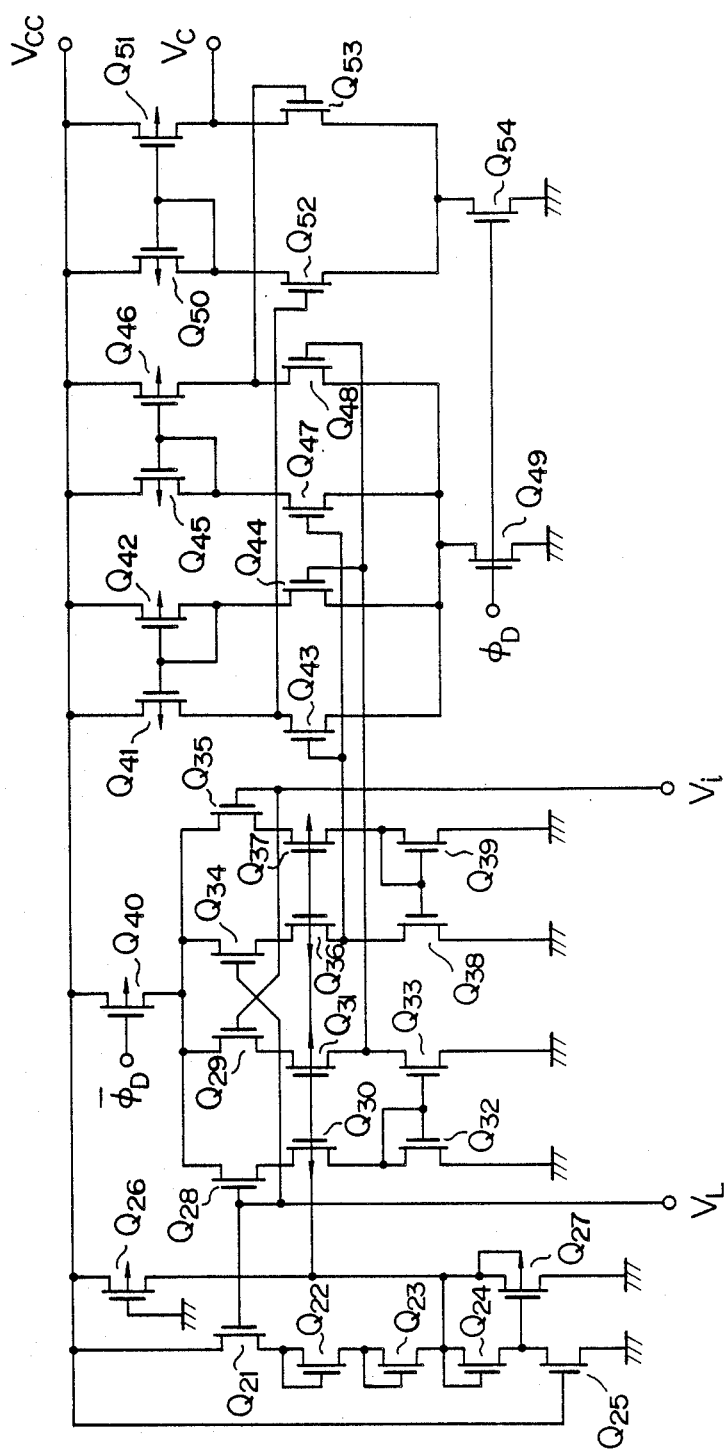
FIGS. 15, 16, 18, 20 and 21 are circuit diagrams according to other embodiments of this invention.

FIG. 15 shows a concrete embodiment of the comparator circuit CA. A feature of this circuit is that a high gain can be obtained, even in the case where the input voltages $V_i$ and $V_L$ are in the proximity of the source voltages. Here $V_i$ represents the voltage at the input terminal from the load side and it is e.g. $V_{01}'-V_{03}'$ in FIG. 9. In the figure, $Q_{21}-Q_{27}$ are bias voltage generators for a first stage amplifier; $Q_{28}-Q_{40}$ constitute the first stage differential amplifier; $Q_{41}-Q_{47}$ constitute a second stage differential amplifier; and $Q_{50}-Q_{54}$ constitute a single ended conversion circuit. Hereinbelow, the working mode will be explained in detail.

At first the reference voltage $V_L$ and the voltage to be compared $V_i$ are applied to the gates of the transistors $Q_{28}$, $Q_{29}$, $Q_{34}$ and $Q_{35}$ in the first stage amplifier. Then, these voltages are level-shifted and appear at the source terminals of the respective transistors. Since $Q_{30}$, $Q_{31}$, $Q_{35}$ and $Q_{37}$ are p-channel MOS transistors, the above voltages are their source-to-gate voltage and change the drain current flowing through each of the transistors. This voltage variation is transformed into another voltage variation by a current mirror circuit consisting of $Q_{32}$, $Q_{33}$ and $Q_{38}$, $Q_{39}$ and outputted to the following stage. In this circuit, a voltage $V_L-3V_T$ produced by the bias voltage generator consisting of $Q_{21}-Q_{27}$ is applied to the gate of the p-channel MOS transistor. It is for obtaining a high voltage gain by driving $Q_{30}$, $Q_{31}$, $Q_{36}$ and $Q_{37}$ in their saturation region (pentode characteristic region) for any value of $V_L$ that always $V_L$ is referred to. Here this is verified by checking the balance point of $V_i=V_L$. At this balance point the voltage between the gate of $Q_{28}$, $Q_{29}$, $Q_{34}$ and $Q_{35}$ and the gate of $Q_{30}$, $Q_{31}$, $Q_{36}$ and $Q_{37}$ is always $3V_T$ independently of $V_{CC}$ and $V_L$. Consequently always a constant current flows through each of the transistors. Then, when the magnitude of the load transistors $Q_{32}$, $Q_{33}$, $Q_{38}$ and $Q_{39}$ is so regulated that their output voltage is 2V, the saturation condition for $Q_{30}$, $Q_{31}$, $Q_{36}$ and $Q_{37}$ can be represented by $V_S-2 \geq V_S-(V_L-3V_T)$, where $V_S$ represents the source voltage. When $V_T=0.7$ V in the above equation (although this value is usually negative for PMOS, here it is represented by its absolute value), the above condition is represented by $V_L \geq 2V_T+2=3.4$. This means that $Q_{10}$, $Q_{11}'$, $Q_{16}$ and $Q_{17}$ are always in their saturation region, when $V_L$ is higher than 3 V. That is, since the maximum value of $V_L$ is $V_{CC}$, when $V_{CC}$ is higher than 3.4 V, a high gain can be obtained, even if the input voltage is $V_{CC}$.

To the contrary, in the second amplifier consisting of $Q_{41}-Q_{49}$, no high gain can be obtained, when the input voltage is $V_{CC}$. This is because, in order that the driving transistors $Q_{43}$, $Q_{44}$, $Q_{47}$ and $Q_{48}$ are driven in their saturation region, when the input voltage is $V_{CC}$, their drain voltage should be higher than $V_{CC}-V_T$, and in this case $Q_{42}$ and $Q_{45}$ in the current mirror circuit, which is the load, are cut-off. Further, even if the voltage is lowered in such a degree that they are not cut-off, since gm of the load transistors becomes large, i.e. the load resistance becomes smaller, the gain s lowered. In general, the input voltage region for obtaining a high gain by using this type of amplifiers is about 1V-3V (when $V_{CC}=5V$). It is for this reason that the output voltage of the first stage amplifier described above is set at 2 V.

Further, these amplifiers are so constructed that they are driven by the signal $\phi_D$ and its complement signal $\overline{\phi}_D$. This is for the purpose of reducing the electric power consumption of the device by stopping the operation of the amplifier, when the limiter operation is unnecessary. In addition, although this comparator circuit is constituted by a 3-stage amplifier, in the case where no high speed operation is necessary but the precision of the output voltage of the limiter need not be so high, it may be constituted only by the first stage amplifier or by a 2-stage amplifier, removing the second stage amplifier. In this case, it is possible to reduce the electric power consumption and the layout area.

Figure 16:
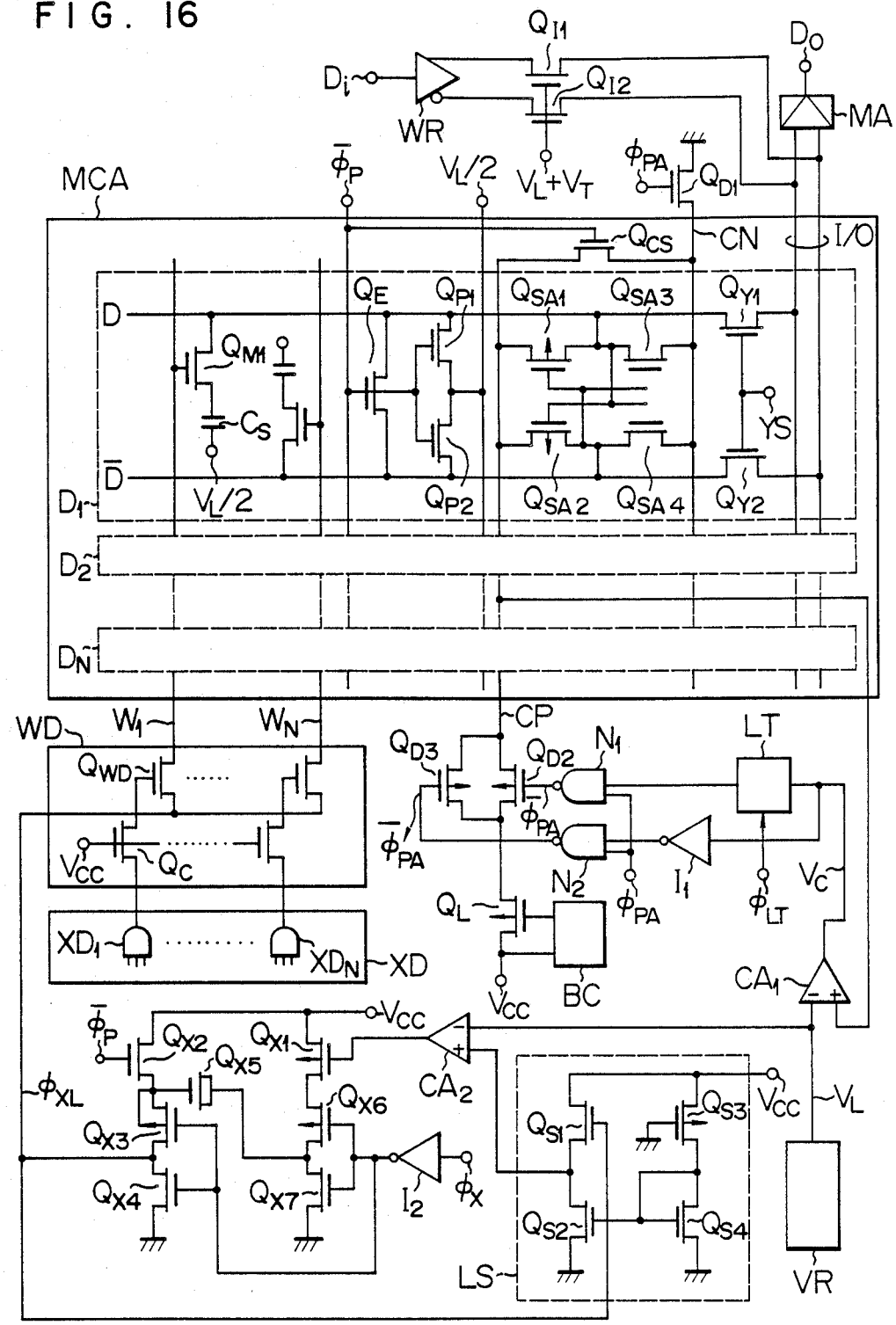

FIG. 16 indicates an embodiment, in which this invention is applied to a dynamic memory (hereinbelow abbreviated to DRAM). In the figure, MCA represents a memory cell array composed of memory cells and sense amplifiers, for which small size MOSs are used. WD indicates word drivers for driving word lines ($W_I-W_N$) and XD represents decoder blocks for selecting the word drivers. Here the voltage limiter is applied to the sense amplifier (the limiter is constituted by CA1, VR, LT, $I_1$, $N_1$, $N_2$, $Q_{D2}$ and $Q_{D3}$), to the word line (CA2, VR, $Q_{XI}$, LS), and to I/0 ($Q_{I1}$, $Q_{I2}$). The working mode is explained below, referring to FIGS. 16 and 17.

At first, when the precharge pulse $\overline{\phi}_P$ is $V_{CC}$, since $Q_{P1}$ and $Q_{P2}$ are turned on, the data line is at the output voltage $V_L/2$ of a $V_L/2$ generator circuit indicated in FIG. 21 (which will be explained later, referring to FIG. 21). Further, a voltage raising condenser $Q_5$ in a $\phi_X$ raising circuit consisting of $Q_{X1}-Q_{X7}$ is charged to $V_{CC}-V_T$ through $Q_{X2}$. Next, when $\overline{\phi}_P$ becomes O and $\phi_X$ reaches $V_{CC}$, the output voltage of an inverter, whose input voltage is $\phi_X$, becomes O, what turns $Q_{X3}$ and $Q_{X6}$ on at the same time. As the result, the output $\phi_{XL}$ of the voltage raising circuit rises and reaches $V_L+V_T$, as indicated in FIG. 17(b). At this time, since the +input of the comparator circuit CA2 is $V_L$, which is lower than $\phi_{XL}$ by $V_T$, owing to the level shift circuit LS, the output of the comparator circuit passes from 0 V to $V_{CC}$, what turns $Q_{X1}$ off. As the result, the rise of $\phi_{XL}$ stops and $\phi_{XL}$ is stabilized at $V_L+V_T$. At the same time the potential of the word line becomes $V_L+V_T$ through the word driver selected by the decoder. By using this $\phi_{XL}$ generator, even if the value of $V_L+V_T$ exceeds $V_{CC}$, since the voltage is raised by the capacitive coupling by means of $Q_{X5}$, it is possible to generate $\phi_{XL}$ with a high speed. Further, owing to leak current through paths from $\phi_{XL}$ to the word line or to interference of other signals, even if the potential of $\phi_{XL}$ is lowered, its potential drop is automatically compensated via LS, CA2, $Q_{X1}$, $Q_{X6}$, $Q_{X5}$ and $Q_{X3}$ and the potential of $V_L+V_T$ is maintained as it is. Here, it is for enabling to write the value of $V_L$ in CS, as it is, without any threshold voltage loss of the memory cell transistor $Q_{M1}$ that $\phi_{XL}$ i.e. the potential of the word line is $V_L+V_T$. The value of $V_T$ in this $V_L+V_T$ is controlled by the threshold voltage of the transistor $Q_{S1}$ in LS. Consequently, if $Q_{S1}$ and $Q_{M1}$ are formed by using transistors fabricated by a same specification, even if $V_T$ fluctuates due to fluctuations in the fabrication process, the object described above can be achieved. In addition, in order to have some margin in the operation described above, it is possible that the potential of the word line is $V_L+2V_T$ by replacing $Q_{S1}$ in LS by 2 MOS transistors connected in series. The switch transistor connected with the word line is turned on by $\phi_{XL}$ and a word line signal produced in this way, and thus information appears in the data line D without loss from the memory cell. At this time this signal is slightly higher than $V_L/2$, if the information in the memory cell is "1" and slightly lower, if it is "0". Since $\overline{D}$ rests to be $V_L/2$, the sense amplifier consisting of $Q_{SA1}$-$Q_{SA4}$ is subsequently driven by using it as the reference level. At this time the drive of the NMOS sense amplifier $Q_{SA3}$ and $Q_{SA4}$ is effected by the signal $\phi_{PA}$ and an NMOS $Q_{D1}$. On the other hand, the drive of the PMOS sense amplifier $Q_{SA1}$ and $Q_{SA2}$ is effected by a PMOS $Q_{D2}$, $Q_{D3}$ serving also as the transistor for voltage control of the limiter, and logical products $\overline{\phi}_{PA}$, $\overline{\phi}_{PA}$ of the signal $\phi_{PA}$ with the output of the comparator circuit CA1. Here, when $\phi_P$ is $V_{CC}$, the potential of the common source is $V_L/2$ in the same way as the data line. Consequently the output of CA1 is 0 V, and the output of an inverter with latch LT (latched, when $\phi_{LT}$ is $V_{CC}$) indicated in FIG. 20 and that of the inverter $I_1$ are $V_{CC}$. Here, when $\phi_{PA}$ is 0 V, since the outputs of the NAND gates $N_1$ and $N_2$ are $V_{CC}$, $Q_{D2}$ and $Q_{D3}$ are in their off state. Next, when $\phi_{PA}$ becomes $V_{CC}$, the outputs of $N_1$ and $N_2$ become 0 V and $Q_{D2}$ and $Q_{D3}$ are turned on, which drive $Q_{SA1}$ and $Q_{SA2}$. At this time, the common source CP rises towards $V_{CC}$ and the data line having a higher voltage raises. On the other hand, since the + input of CA1 is connected with the common source CP, when the potential of CP becomes $V_L$, which is equal to the −, input, the output of CA1 passes from 0 V to $V_{CC}$, what inverts the outputs of $N_1$ and $N_2$ from 0 V to $V_{CC}$ As the results, $Q_2$ and $Q_3$ are turned off and the rise of CP is stopped at $V_L$. Then, by a signal YS the I/O line and the data line are connected and read-out or write-in of the information is effected. FIGS. 17(a)-17(f) indicate waveforms during a write-in operation. In this case, when an information, which is opposite to the information, which has been just read out, is written in, the curves representing the voltages of the data lines D and $\overline{D}$ cross over at a potential, which is approximately at the middle point between 0 V and $V_L$. In the time zone in the proximity of the cross point of the voltages of D and $\overline{D}$ all the transistors in the sense amplifier connected with this data line are turned on and current flows from the common source CP to CN. At this time, since $Q_{D2}$ and $Q_{D3}$ are in their off state, the voltage of CP begins to fall from $V_L$. At this moment CA1 detects the voltage fall and tries to change its output voltage from $V_{CC}$ to 0 V, $Q_{D2}$ and $Q_{D3}$ on and to return CP to $V_L$. However, since the current $I_P$ flowing therethrough at this time is very small with respect to the current $I_{P0}$ flowing at the amplification of the first signal in the operation of the sense amplifier, because it is in only one sense amplifier selected by YS that all the transistors therein are turned on, if $Q_{D2}$ and $Q_{D3}$ are turned on at the same time, electric power for the driving operation is uselessly consumed, and, further, there is a risk that the voltage will rise excessively beyond $V_L$. In order to prevent this, in this embodiment, the ratio of $Q_{D2}$ to $Q_{D3}$ is regulated so as to be approximately equal to the current ratio of $I_{P0}$ to $I_P$ described above and only $Q_{D3}$ is switched on and off. In FIG. 16, an inverter with latch LT is used in order that $Q_{D2}$ is not switched on by variations in the output voltage of CA1. After that, $\overline{\phi}_P$ becomes again $V_{CC}$ and the data lines separated to 0 V and $V_L$ are short-circuited. The operations described above are repeated thereafter.

Figure 18:
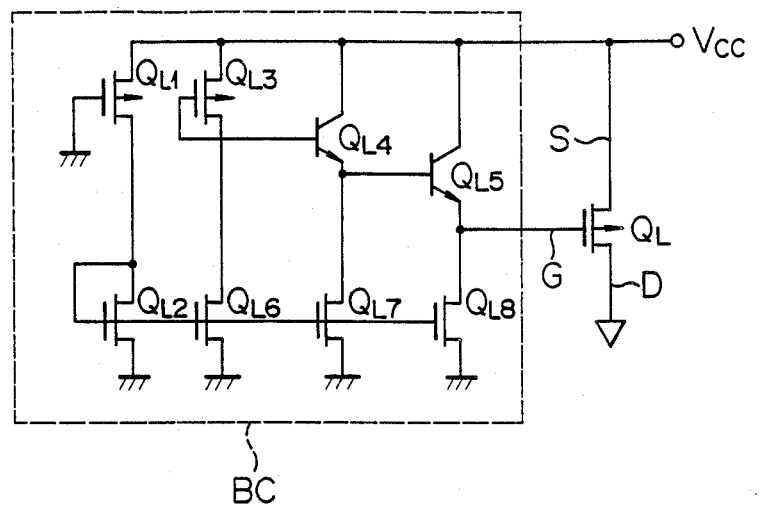

Further, here, a circuit consisting of $Q_L$ and BC, which is illustrated in detail in FIG. 18, is connected in series with $Q_{D2}$ and $Q_{D3}$. This is a constant current circuit for reducing the peak current in the operation of the LSI.

That is, in the case where the output voltage is controlled by switching on and off of the p-channel MOS transistors $Q_{D2}$ and $Q_{D3}$ as in this embodiment, the voltage applied between the gate and the source is $V_{CC}$ as in the case where $V_{CC}$ is outputted as it is and the source-to-drain voltage is greater than it. Consequently, in spite of lowering of the driving voltage, for the same channel width of the transistors, the peak current may be greater than that in the case of the $V_{CC}$ output. However, since $V_L$ is lower than $V_{CC}$, the period of time necessary for reaching $V_L$ becomes shorter and as the result the current pulse width is reduced. The current pulse width can be represented by an equation $t_w=2\,C_DV/I_P$, where it is supposed that the current waveform is triangular, $C_D$ is the capacity of all the data lines; $I_P$ represents the peak value; and V indicates the output voltage. This equation is transformed into $I_P=2C_DV/t_w$. Next, if $I_P$ is a constant value by adding a constant current circuit, $I_P=C_DV/t_w$ is obtained. Using the equations stated above, $I_P=2C_DV_{CC}/t_w$ is obtained, in the case where no limiter is used. To the contrary, in the case where a limiter and a constant current circuit are added as in this embodiment, $I_P=C_DV_L/t_w$ is obtained. Consequenlty it is possible to reduce the peak current for a same $t_w$ by a factor as large as 60% under a condition of $V_{CC}=5V$ and $V_L=4V$ owing to the combination of the voltage limiter and the current limiter. Another advantage is that, since the charging time for the load capacity is constant, independently of $V_{CC}$, the delay compensation of the feedback loop using the wiring resistance can be precisely effected. As explained above, a considerable reduction of the peak current and a stable operation of the voltage limited are enabled by the combination of the voltage limiter and the current limiter.

According to the embodiments described above, since the voltage in the word line, the potentials of the data line and the I/O line are determined by referring to the output voltage of the reference voltage generator varies due to variations in $V_{CC}$ and the process, a stable circuit drive is possible, because a constant relationship is voltage is always maintained.

FIG. 18 illustrates a concrete embodiment of the current limiter circuit BC stated previously. $L_1$ and $Q_{L2}$ generate the gate bias voltage for $Q_{L6}$, $Q_{L7}$ and $Q_{L8}$, and $Q_{L3}$, $Q_{L4}$ and $Q_{L5}$ generate the gate bias voltage for $Q_L$. Further, $Q_{L6}$, $Q_{L7}$ and $Q_{L8}$ serve as current sources making constant current flows through $Q_{L3}$, $Q_{L4}$ and $Q_{L5}$, respectively. $Q_L$ is the output transistor receiving a constant bias voltage and outputting a constant current from its drain.

Figure 19:
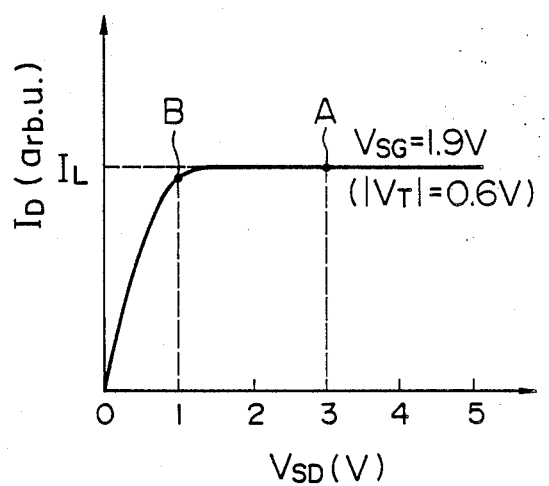
FIG. 19 is a diagram showing a characteristic curve of the circuit indicated in FIG. 18.

FIG. 19 indicates the relation between the source-to-drain voltage and the drain current of $Q_L$ indicated in FIG. 18. In the figure, the region between the points A and B is a working region at $V_{CC}=5V$ and it can be seen that the value of the current is approximately constant there. That is, a constant current source is realized in this way.

Figure 17:
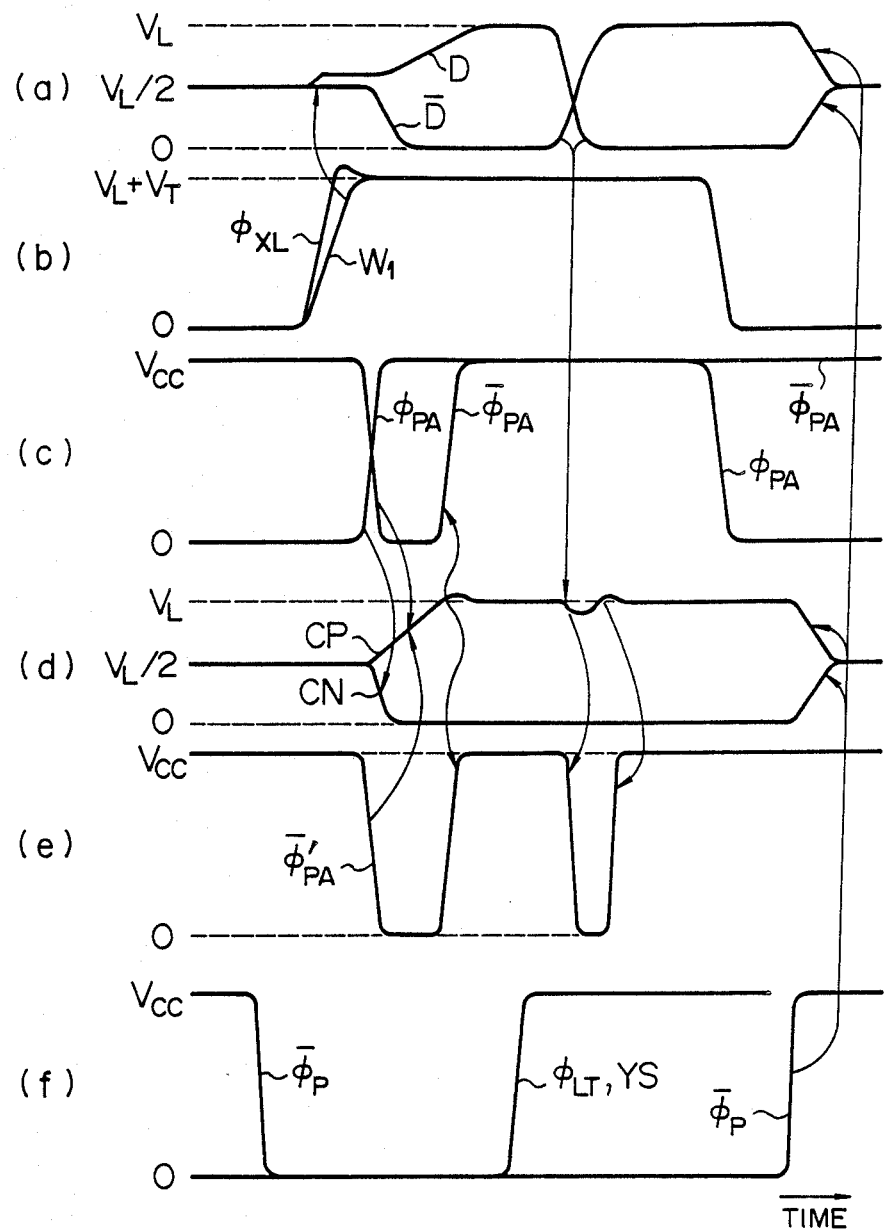
FIGS. 17(a)-(f) are schemes showing their working waveforms.
Figure 20:
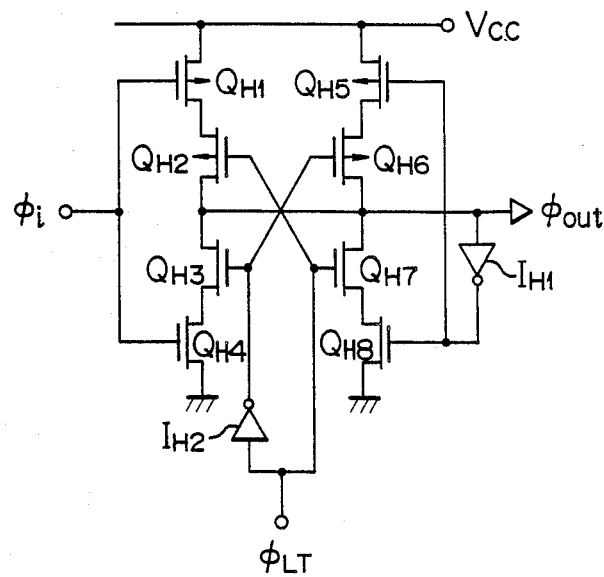

FIG. 20 illustrates a concrete embodiment of the inverter with latch LT indicated in FIG. 17. Since $Q_{H2}$ and $Q_{H3}$ are turned on, when $\phi_{LT}=0$, this circuit works as an inverter inverting $\phi_i$ by means of $Q_{H1}$ and $Q_{H2}$. Then, when $Q_{LT}=V_{CC}$, since $Q_{H6}$ and $Q_{H7}$ are turned on and $QH_6$ and $QH_7$ are turned off, a closed loop is formed by $Q_{H5}$, $Q_{H8}$ and an inverter $I_{H1}$ and thus the information just before the moment where $\phi_{LT}=V_{CC}$ is established is maintained as it is. In this way $\overline{\phi_i}$ is latched at $\phi_{LT}=V_{CC}$. At this time, since $Q_{H2}$ and $Q_{H3}$ are turned off, as described previously, this is not influenced by the input.

Figure 21:
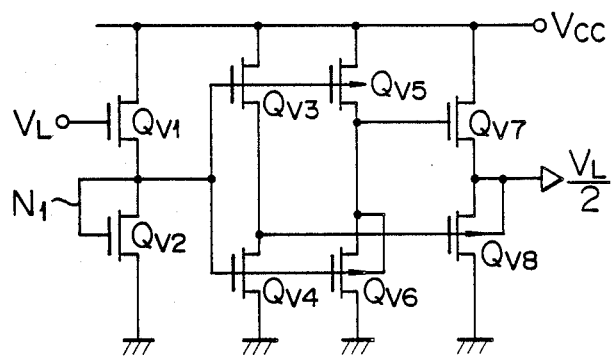

FIG. 21 shows a circuit feeding the terminal indicated by $V_L/2$ in FIG. 16 with a voltage of $V_L/2$. In this circuit the voltage of $V_L/2$ is produced at $N_1$ by receiving $V_L$ at the gate of $Q_{v1}$ and by making the gm ratios of $Q_{v1}$ and $Q_{v2}$ equal Next this voltage is transformed into a low impedance output by a complementary source follower circuit consisting of $Q_{v3}-Q_{v8}$ and outputted. The features of this circuit are that the load of the $V_L$ generator circuit is reduced by the fact that $V_L$ is received by the gate and that it is scarcely influenced by fluctuations in the load owing to the utilization of the complementary source follower circuit.

Although this invention has been explained in detail, referring to some preferred embodiments, the scope where this invention can be applied is not at all restricted thereto, but it can be widely applied. For example, although principally cases, where n- and p-channel MOS transistors and bipolar transistors were used as constituent elements, were explained in the embodiments, this invention can be applied also in the case, where the semiconductor device is constituted by one or an arbitrary combination of them, as well. Furthermore, it can be applied to LSIs, for which semiconductors other than silicon, e.g. compound semiconductors such as gallium arsenide (GaAs), etc. are used. Further, although this invention was explained, taking DRAMs as a concrete application example of the limiter circuit, it can be widely applied to LSIs in general such as other logic LSIs, static memories (SRAM), read only memories (ROM), etc. It is a matter of course that this invention can be applied as it is, even in the case where the DRAMs are a part of a whole LSI, e.g. DRAMs included in the interior of an LSI for a microprocessor in their concrete application examples. In addition, although examples were shown in the embodiments, where the circuits driven by the output of the limiter were composed of small size elements, this invention is applicable to cases where the size of the elements is equal to that of the others and the limiter circuit is used principally for lowering the electric power consumption and reducing the electric current. Further, although the case, where the source voltage $V_{CC}=5V$, was principally explained, the source voltage is not at all restricted thereto but it can be arbitrarily set. The output of the limiter can be also arbitrarily set. Thus it can be set not only lower than $V_{CC}$ but also at a voltage higher than $V_{CC}$, as indicated in the embodiment described, referring to FIG. 16.

As explained above, according to this invention, since a voltage limiter is used and its driving force is controlled exclusively for a kind of operations and a nature of the loads connected therewith, the loads do not interfere eath other, but they can be driven stably. Further their electric power consumption can be reduced. In addition, since the delay produced in their feedback circuit can be compensated; their output can be regulated precisely so as to be equal to their reference voltage.

It is further understood by those skilled in the art that the foregoing description is made on preferred embodiments of the disclosed device and that various changes and modifications may be made in the invention without departing from the spirit and scope thereof.

What is claimed is:

1. A semiconductor device comprising:
    a first and a second circuit coupled to at least one external power source; and
    a plurality of voltage converter means each transforming a voltage of the external power source into an output voltage different than the voltage of the external power source,
    wherein at least said first circuit is coupled to said external power source through one of said voltage converter means so that said first circuit is driven by the output voltage of said one voltage converter means, and further wherein said voltage converter means includes control means coupled to receive a first signal for controlling the output voltage of said one voltage converter means based on said first signal which corresponds to a second signal, which second signal controls operation of said first circuit, thereby controlling load driving power of said one voltage converter means,
    wherein said second signal is a load driving control signal applied to said first circuit to control the operation of said first circuit, and wherein said first signal is synchronized to said second signal and is applied to said voltage converter means to control the operation of said voltage converter means to be synchronized with the operation of the first circuit.

2. A semiconductor device according to claim 1, wherein said first circuit comprises a semiconductor memory circuit.

3. A semiconductor device according to claim 2, wherein said second circuit is driven by the output voltage of said voltage converter means.

4. A semiconductor device according to claim 3, wherein said voltage converter means includes separate voltage converter units for generating output voltages for driving said first and said second circuit, respectively.

5. A semiconductor device according to claim 4, wherein said second circuit constitutes a peripheral circuit for the semiconductor memory circuit of said first circuit.

6. A semiconductor device according to claim 5, wherein said peripheral circuit for the semiconductor memory circuit includes bipolar transistors.

7. A semiconductor device according to claim 2, wherein said semiconductor memory circuit comprises MOS transistors and capacitors.

8. A semiconductor device according to claim 2, wherein said semiconductor memory circuit of said first circuit is a static memory circuit.

9. A semiconductor device according to claim 2, wherein said semiconductor memory circuit of said first circuit is a read-only-memory circuit.

10. A semiconductor device according to claim 2, wherein said second circuit comprises a microprocessor capable of operation on data to be stored in said semiconductor memory circuit.

11. A semiconductor device comprising:
a first and a second circuit coupled to at least one external power source; and
at least one voltage converter means transforming a voltage of the external power source into an output voltage different than the voltage of the external power source,
wherein at least said first circuit is coupled to said external power source through said voltage converter means so that said first circuit is driven by the output voltage of said at least one voltage converter means, and further wherein said voltage converter means comprises control means including at least one driving transistor which is capable, when made operative, of controlling the output voltage of said voltage converter, said at least one driving transistor being made operative or inoperative selectively depending on a first signal which corresponds to a second signal, which second signal controls an operating condition of said first circuit, thereby controlling a load driving power of said converter means,
wherein said second signal is a load driving control signal applied to said first circuit to control the operation of said first circuit, and wherein said first signal is synchronized to said second signal and is applied to said voltage converter means to control the operation of said voltage converter means to be synchronized with the operation of the first circuit.

12. A semiconductor device according to claim 11, wherein said control means includes at least two driving transistors which are respectively made operative or inoperative, selectively, depending on the operation condition of said first circuit to control said load driving power of said converter circuit.

13. A semiconductor device according to claim 12, wherein said voltage converter includes a differential amplifier having a first input receiving a reference voltage and a second input receiving, a control signal from said first circuit, wherein said two driving transistors are MOS transistors both having source-drain paths coupled to said first circuit, and wherein an output of the differential amplifier is coupled to gates of both of the driving transistors for controlling current flow through the source-drain paths of the driving transistors to the first circuit in accordance with the output of said differential amplifier.

14. A semiconductor device according to claim 13, further comprising a switch coupled between the output of the differential amplifier and the respective gates of the two driving transistors for selectively only connecting the output of the differential amplifier to one of the gates of the driving transistors at a time.

15. A semiconductor device according to claim 13, further comprising a first logic circuit for coupling the output of the differential amplifier to the gate of one of the driving transistors and a second logic circuit for coupling the output of the differential amplifier to the gate of the other of said driving transistors for independently controlling the operation of the driving transistors.

16. A semiconductor device according to claim 15, further comprising an inverter coupled between the output of the differential amplifier and an input of the second logic circuit so that the second logic circuit receives an input inverted from an input received by the first logic circuit.

17. A semiconductor device according to claim 16, further comprising a latch circuit coupled between the output of the differential amplifier and an input to the first logic circuit.

18. A semiconductor device according to claim 11, wherein said first circuit comprises a semiconductor memory circuit.

19. A semiconductor device according to claim 18, wherein said second circuit is driven by the output voltage of said voltage converter means.

20. A semiconductor device according to claim 19, wherein said voltage converter means includes separate voltage converter units for generating output voltages for driving said first and said second circuit respectively.

21. A semiconductor device according to claim 20, wherein said second circuit constitutes a peripheral circuit for the semiconductor memory circuit of said first circuit.

22. A semiconductor device according to claim 21, wherein said peripheral circuit for the semiconductor memory circuit includes bipolar transistors.

23. A semiconductor device according to claim 18, wherein said semiconductor memory circuit comprises MOS transistors and capacitors.

24. A semiconductor device according to claim 18, wherein said semiconductor memory circuit of said first circuit is a static memory circuit.

25. A semiconductor device according to claim 18, wherein said semiconductor memory circuit of said first circuit is a read-only-memory circuit.

26. A semiconductor device according to claim 18, wherein said second circuit comprises a microprocessor capable of operating on data to be stored in said semiconductor memory circuit.

27. A semiconductor device according to claim 11, wherein said voltage converter means includes a differential amplifier having a first input receiving a reference voltage and a second input receiving a control signal from said first circuit, wherein said driving transistor is an MOS transistor having a source-drain path coupled to said first circuit, and wherein an output of the differential amplifier is coupled to a gate of the MOS transistor for controlling current flow through the source-drain path of the MOS transistor to said first circuit in accordance with an output of said differential amplifier.

* * * * *